United States Patent [19]

Mattisson

[11] Patent Number: 4,479,093
[45] Date of Patent: Oct. 23, 1984

[54] AMPLIFIER HAVING HIGH COMMON MODE REJECTION

[75] Inventor: Sven Mattisson, Bjarred, Sweden

[73] Assignee: Inventab Audio Kb, Lund, Sweden

[21] Appl. No.: 327,075

[22] Filed: Dec. 3, 1981

[51] Int. Cl.$^3$ .............................................. H03F 3/45
[52] U.S. Cl. .................................... 330/258; 330/297
[58] Field of Search ........................ 330/258, 259, 297

[56] References Cited

U.S. PATENT DOCUMENTS 3,530,396  9/1970  Rudolph .................... 330/297 X

OTHER PUBLICATIONS

Kootsey, Johnson, IEEE Trans. on Biomedical Engineering, Sep., 1973, pp. 389-391.
Gagné et al., IEEE Trans. on Biomedical Engineering, Jan., 1976, pp. 81-83.
Bergveld, "Alternative Design of a Unity-Gain Follower with Buffer", *IEEE Trans. on Biomedical Engineering* V. BME-25, No. 6, Nov. 1978, pp. 567-568.
Garde, "Schemes for Increased Output-Voltage Swing from Operational Amplifiers" *Electronics Letters*, V. 13, No. 4, pp. 111-112, Feb. 17, 1977.
Younge, "Bootstrapping Bias Supply Increases IC Voltable Capacity", *Electronics*, V. 41, No. 22, Oct., 1968 pp. 90, 91.
Ride, "Increased Output Voltage for Op-Amps," *Wireless World*, Oct. 1977, p. 64.

*Primary Examiner*—James B. Mullins
*Attorney, Agent, or Firm*—Yount & Tarolli

[57] ABSTRACT

An amplifier (10) is disclosed including circuity for improving the amplifiers performance, particularly the common mode rejection of differential amplifiers, by adding the amplifier input signal to the power supply signals which power the amplifier. Voltage dividers (42, 44) are connected between the amplifier output (16) and each of the two power supply rails (26, 28). Each divider includes resistors (46, 48; 50, 52) selected so that the amplifier output is divided down by a factor equal to the gain of the amplifier. The junction signals ($V_{J1}$, $V_{J2}$) provided by the two voltage dividers thus each includes a component equal to the input signal. The junction voltages are applied to the amplifier power input terminals (18, 20) by respective transistors (60, 62), each connected in a voltage follower arrangement. One embodiment (FIG. 4) incorporates a servo amplifier (100) for DC offset stabilization. Impedances (104, 106) couple the output of the servo amplifier to the voltage dividers so that no loss in common mode rejection results from servo operation.

2 Claims, 6 Drawing Figures

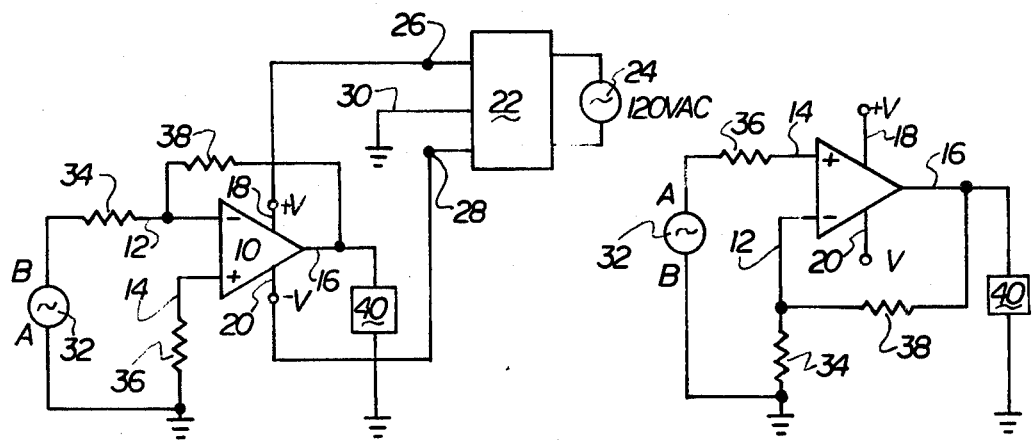
FIG. 1A
PRIOR ART
FIG. 1B
PRIOR ART
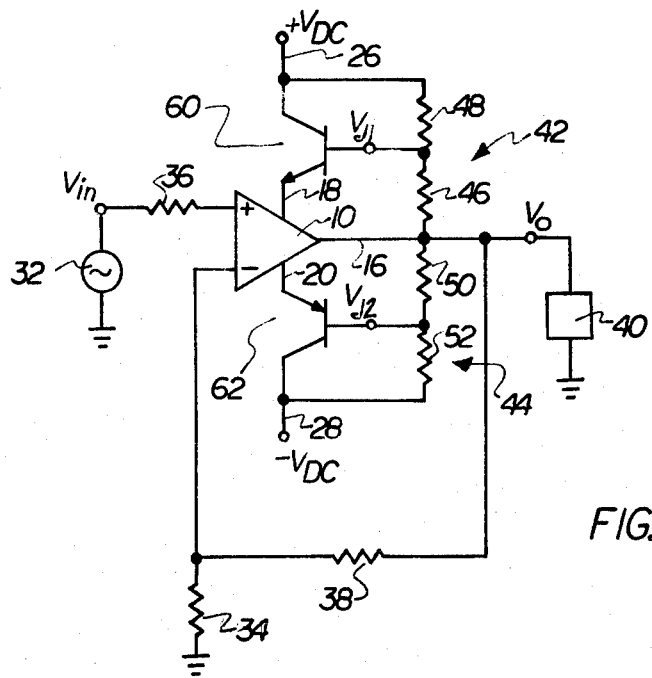
FIG. 2

AMPLIFIER HAVING HIGH COMMON MODE REJECTION

BACKGROUND AND FIELD OF THE INVENTION

The present invention relates to amplifiers, and more particularly to an amplifier circuit wherein the input signal is added to the power supply voltages which are applied to the amplifier so as to thereby improve the amplifier's rejection of common mode signals.

Pre-amplifiers are circuits for amplifying the signals provided by low level signal sources to a higher level suitable for further processing. In addition to providing gain, a pre-amplifier should exhibit a low output impedance and an input impedance selected in accordance with the type of signal source to which it is connected. The pre-amplifier should also provide little or no degradation of the signal-to-noise ratio of the signal being amplified.

One type of low level signal source with which pre-amplifiers are commonly employed is the phono cartridge used to convert the undulations in the grooves in phonographic records into electrical signals. A phono pre-amplifier should preferably have high input impedance so as to minimize the signal loading on the phonographic cartridge. It is desirable to use a differential amplifier for the input stage of a phono pre-amplifier in view of the high gain, low noise and good common mode rejection of differential amplifiers. There are, however, certain performance trade-offs in the selection of a particular differential amplifier configuration for this purpose.

Differential amplifiers have two inputs and ideally provide an output signal $V_o$ equal to a gain factor $G_d$ (usually referred to as the differential mode gain factor) times the difference between the signals applied to the two inputs of the amplifier. Unfortunately, practical differential amplifiers also have a small but nonzero common mode gain factor $G_c$ whereby the output also includes a component equal to the gain factor $G_c$ times the sum of the signals applied to the two inputs. The common mode component in the output signal is a distortion term and is undesirable.

In order to reduce the effect of the common mode gain of the amplifier, the amplifier should preferably be configured so that the common mode signal, i.e., the sum of the two input signals, is minimized. Unfortunately, the amplifier configuration which produces the lowest common mode signal also provides the lowest input impedance. Another amplifier configuration provides substantially higher input impedance, but has a higher common mode signal whereby a greater amount of common mode distortion exists in the output signal provided by the amplifier. A trade-off therefore exists between input impedance and common mode distortion in such differential amplifiers.

SUMMARY OF THE INVENTION

It has been found that the common mode rejection ratio of a high input impedance amplifier can be improved by adding the input signal to the signals appearing at both of the power supply terminals of the amplifier so that the voltage difference between the signal on the input terminal of the amplifier and either of the power supply terminals remains constant. This effectively eliminates the common mode input signal, thereby reducing common mode distortion in the amplifier output.

In accordance with the present invention particular apparatus is provided for adding the input signal to the power signals appearing on the two power supply terminals of the amplifier. This apparatus includes voltage dividers connected between the output terminal of the amplifier and each of the power output terminals of a DC power supply. The voltage dividers each comprise two impedances connected in series and having a ratio selected in accordance with the gain of the amplifier so that the signal appearing at the junction of the two impedances includes a component corresponding to the input signal, and also includes a DC component corresponding to the DC power supply signal times the ratio of the two resistances. The signals provided by the voltage appearing at voltage dividers are supplied to respective power input terminals of the amplifier.

A modified circuit is also described which provides automatic DC offset stabilization without reintroducing any common mode distortion.

In the disclosed embodiment the amplifier is a differential amplifier including two resistances connected in a degenerative feedback arrangement. The ratio of the two resistors in the feedback loop is the same as the ratio of the impedances included in the two voltage dividers connected between the output of the amplifier and the power supply outputs.

BRIEF DESCRIPTION OF THE DRAWINGS

The foregoing and other objects and advantages of the present invention will become more readily apparent from the following detailed description, as taken in conjunction with the accompanying drawings, wherein:

FIGS. 1A and 1B are schematic illustrations of two prior art differential amplifier circuit configurations;

FIG. 2 is a schematic illustration of a differential amplifier circuit in accordance with the teachings of the present invention;

DETAILED DESCRIPTION

Figure 3:
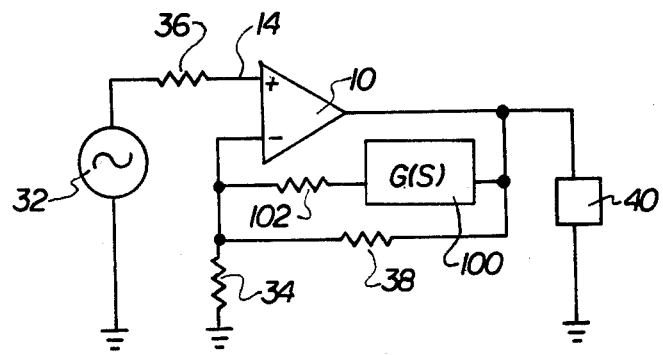
FIG. 3 is a schematic representation of one manner of reducing DC offset in differential amplifier circuits.

FIGS. 1A and 1B illustrates two conventional methods of interconnecting a signal source and a differential amplifier. In each case a differential amplifier 10 is provided including an inverting input 12, a noninverting input 14, an output 16, and two power input terminals 18 and 20. Power is supplied to the two power input terminals 18 and 20 from a power supply, generally indicated at 22. Power supply 22 provides positive and negative DC power supply voltages $+V$ and $-V$ at power output terminals 26 and 28. The power output terminals 26 and 28 of the power supply 22 are respectively connected to the power input terminals 18 and 20 of the differential amplifier 10.

The two output terminals B and A of a signal source 32 (which may, for example, be the cartridge of a phonograph turntable) are connected to the two inputs 12 and 14 of the differential amplifier through input resistors 34 and 36, respectively. A feedback resistor 38 is connected between the output 16 and the noninverting input 12 to provide degenerative feedback. A load 40 is driven by the amplifier, and is shown as connected between the output 16 and ground. (The grounded end of the load 40 could instead be connected to a suitable voltage source, of course.)

The sole difference between the amplifier arrangements of FIGS. 1A and 1B is that in FIG. 1A the A side of the signal source is grounded, whereas in FIG. 1B the B side of the signal source is instead grounded. This distinction produces some important operational differences between the two amplifiers. The amplifier of FIG. 1A has a very low common mode signal, and hence has very low common mode distortion in the output signal provided thereby. The amplifier of FIG. 1B, however, although having a much higher common mode signal and thereby providing greater common mode distortion in its output, does provide a much higher input impedance than the FIG. 1A amplifier, and hence produces less loading on the signal source than does the amplifier of FIG. 1A.

More particularly, the input impedance of the amplifier of FIG. 1A is equal to resistor 34 plus the parallel combination of the input resistance of the amplifier 12 and resistor 38 (the output impedance of the amplifier 10 is very low, hence resistor 38 may be considered to be connected between the amplifier input 12 and ground). Since the input impedance of the differential amplifier 10 is extremely high, for practical purposes the input impedance of the amplifier of FIG. 1A, as seen by the signal source 32, may be considered to be the additive sum of the two resistances 34 and 38.

In the amplifier of FIG. 1B, however, the input impedance of the circuit as seen by the signal source 32 represents the additive combination of the input impedance of the amplifier 10 and the input resistor 36. This input impedance is very high since the amplifier 10 has a very high input impedance. As a consequence, the amplifier configuration of FIG. 1B provides substantially less loading upon the signal source 32 than does the amplifier arrangement of FIG. 1A.

Unfortunately, the amplifier configuration of FIG. 1B suffers from increased distortion due to common mode amplification by the amplifier. The differential amplifier provides an output signal having the form:

$$V_o = G_d(VP - VN) + G_c(VP + VN) \quad (1)$$

where $V_o$ is the amplifier output signal
VP is the signal at the noninverting input 14
VN is the signal at the inverting input 12
$G_d$ is the differential mode gain of the amplifier, and
$G_c$ is the common mode gain of the amplifier.

Ideally, the common mode gain $G_c$ of the amplifier will be equal to zero. Unfortunately, differential amplifiers are not ideal devices, and have small but nonzero common mode gain factors. To reduce common mode distortion it is therefore desirable to minimize the common mode signal (i.e., VP+VN).

In the amplifier arrangement of FIG. 1A the common mode signal is quite low. This is because the two inputs of the amplifier 10 are effectively both at ground voltage level. The inverting input 14 is at ground potential because it is directly connected to ground through the input resistor 36. The noninverting input 12, on the other hand, is forced to the same voltage level appearing at the noninverting input (i.e., to ground potential) through the operation of the negative feedback loop represented by the feedback resistor 38. The common mode signal is therefore very low in amplitude, and little common mode distortion exists at the output.

In the amplifier arrangement of FIG. 1B, however, the common mode signal is essentially twice the magnitude of the input signal since the input signal generated by the input signal source 32 in this case appears at both of the inputs of the amplifier 10. It appears at the noninverting input terminal 14 of the amplifier since that input is directly connected to the signal source 32. (There is no appreciable voltage drop across resistor 36 because the input impedance of the amplifier 10 is very much greater than the impedance of resistor 36.) The same signal also appears at the inverting input 12 due, again, to the degenerative feedback introduced by the feedback resistor 38. The common mode signal is the additive sum of these two signals, or twice the input signal, as stated previously. This substantial common mode signal introduces a distortion component in the output signal provided by the amplifier 10. It would be desirable if some means could be provided for eliminating the common mode distortion component.

It has been found that one method of eliminating the common mode distortion component is by modulating the power supply terminals 18 and 20 of the differential amplifier with the input signal. This effectively reduces the common mode signal to zero since the voltage difference between the signals appearing at the input terminals 12 and 14 and the power supply signals appearing at the power input terminals 18 and 20 remains constant. FIG. 2 illustrates an amplifier employing a circuit in accordance with the teachings of the present invention for accomplishing this.

In FIG. 2 the differential amplifier 10 is again shown connected in the fashion of FIG. 1B, whereby the amplifier presents a very high input impedance to the input signal source 32. Voltage dividers 42 and 44 are provided to derive the signals which are to be applied to the power input terminals 18 and 20 of the amplifier 10. Voltage divider 42 consists of two resistors 46 and 48 connected in series between the output terminal 16 of the differential amplifier 10 and the positive voltage output 26 of the power supply 22. The resistor divider 44, on the other hand, consists of two resistances 50 and 52 connected in series between the output terminal 16 of the amplifier 10 and the negative voltage output 28 of the power supply 22. The resistance values of resistors 46, 48, 50 and 52 are selected so that the ratios of resistors 46 and 48 and resistors 50 and 52 are the same as the ratio of resistors 38 and 34.

Using conventional network analysis techniques, it can be shown that the voltage $V_{J1}$ at the junction between resistors 46 and 48 is:

$$V_{J1} = +V_{DC}[R_{46}/(R_{46}+R_{48})] + V_o[R_{48}/(R_{46}+R_{48})] \quad (2)$$

Similarly, the voltage $V_{J2}$ at the junction between resistors 50 and 52 is:

$$V_{J2} = -V_{DC}[R_{50}/(R_{50}+R_{52})] + V_o[R_{52}/(R_{50}+R_{52})] \quad (3)$$

It is also known that the relationship between the input and output signals $V_{in}$ and $V_o$ in a differential amplifier arrangement as shown in FIGS. 1B and 2 is:

$$V_{in} = V_o[R_{34}/(R_{34}+R_{38})] \quad (4)$$

From this it automatically follows that, since the ratio of resistors 38 and 34 is the same as the ratio of resistors 46 and 48 and the ratio of resistors 50 and 52, the second terms in equations (2) and (3) are simply the input signal, hence:

$$V_{J1} = +KV_{DC} + V_{in} \quad (5)$$

$$V_{J2} = -KV_{DC} + V_{in} \quad (6)$$

where $$K = R_{38}/(R_{34} + R_{38}) \quad (7)$$

Thus, the voltages appearing at the junctions between resistors 46 and 48 and resistors 50 and 52 have the desired forms for the power supply signals to be applied to the power supply terminals of the differential amplifier 10.

Unity gain buffer amplifiers are provided which are responsive to the voltage signals $V_{J1}$ and $V_{J2}$ for providing them to the power supply terminals 18 and 20 of the differential amplifier 10 at low impedance levels. In FIG. 2 bipolar junction transistors 60 and 62 represent the unity gain buffer amplifiers. The transistor 60 is an NPN transistor having its base connected to the junction between resistors 46 and 48, its collector connected to the power output terminal 26 and its emitter connected to the positive power input terminal 18 of the amplifier 10. The transistor 62, on the other hand, is a PNP transistor having its base connected to the junction between resistors 50 and 52, its collector connected to power output terminal 28 and its emitter connected to the negative power input terminal 20 of the amplifier 10. The transistors 60 and 62 operate as emitter followers, with the amplifier 10 being the emitter impedance of both transistors. The signals at the terminals 18 and 20 will comprise the voltages $V_{J1}$ and $V_{J2}$, respectively minus and plus a fixed voltage drop (of approximately 0.5 volts) introduced by the base-emitter junction of the respective transistor 60 and 62.

From the foregoing it is apparent that the input signal $V_{in}$ is summed with the power signals which are applied to the power supply terminals 18 and 20 of the differential amplifier 10 such that the voltage difference between the signals applied to the input terminals 12 and 14 and the power supply terminals 18 and 20 remains constant. This effectively removes the common mode signal, providing substantial reduction in the distortion introduced by common mode amplification of the amplifier 10.

The amplifiers of FIGS. 1 and 2 are susceptible to DC offsets producing substantial spurious DC signals at the output of the amplifier. It is therefore desirable to include some circuit for forcing the DC level of the output signal to a ground voltage level. A conventional method of modifying the circuit of FIG. 1B in order to provide this automatic DC offset stabilization is shown in FIG. 3. In this Figure, the amplifier 10 is again shown having an input signal applied to its noninverting input 14 through an input resistor 36. The output signal from the amplifier 10 is again applied to a load 40. A feedback resistor 38 is provided and another resistor 34 is connected between the inverting input and ground.

DC offset stabilization is provided by including an additional feedback path having a feedback amplifier 100 therein. This feedback amplifier is sometimes referred to in the art as a servo amplifier. The amplifier 100 has a low pass filter characteristic such that the circuit provides high gain for DC signals, but essentially zero gain for AC signals. Any DC offset appearing at the output of the amplifier 10 will be substantially amplified by the amplifier 100 and fedback to the negative input, thereby forcing the DC level at the output of the amplifier to ground potential. The feedback amplifier 100 has a very slow time constant, on the order of several tenths of a second, whereby its output does not change rapidly. This assures that the DC level at the output of the amplifier 10 is quite stable. The resistor 102 which is connected in series with the feedback amplifier 100 isolates the output of the feedback amplifier 100 from the negative input of the amplifier 10. Resistor 102 is necessary because the amplifier 100 has a very low output impedance. If the resistor 102 were not included, the low output impedance of the feedback amplifier 100 would substantially reduce the effective resistance between the inverting input of the amplifier 10 and ground, thereby substantially increasing the gain of the amplifier 10. By including the resistor 102, the output of the feedback amplifier 100 is isolated from the inverting input 10, while still permitting the feedback of the signals from the feedback amplifier 100 to the noninverting input.

Figure 4:
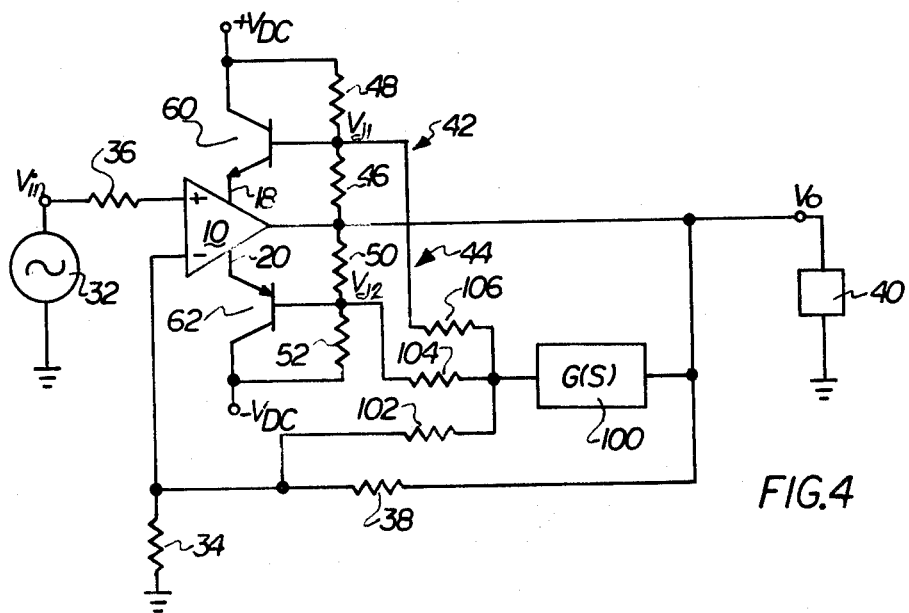
FIG. 4 is a circuit schematic illustrating the fashion in which the circuitry of FIG. 2 can be modified to reduce the effect of DC offsets.

FIG. 4 illustrates a fashion in which the FIG. 2 embodiment of the present invention can be modified to include a feedback amplifier for offset stabilization. As with preceding figures, those elements of FIG. 4 which correspond with similar elements of preceding Figures have been identified by corresponding reference numerals.

Since the feedback amplifier 100 has zero gain, except for DC and very low frequency signals, the contribution of the additional feedback path may be ignored at other frequencies. The operation of the FIG. 4 circuit is therefore the same as the operation of the FIG. 2 circuit except for the DC and very low frequency signals.

As in FIG. 3, the FIG. 4 embodiment of the present invention includes a feedback amplifier 100 whose output is applied to the inverting input of the amplifier 10 through a resistor 102. Because of the operation of this feedback amplifier 100, the output signals $V_o$ from the amplifier 10 will not precisely follow the input signal $V_{in}$. Instead, the DC and near DC components of the input signals $V_{in}$ will be substantially attenuated due to the operation of the feedback amplifier 100. As a result of this, the AC component of the voltages $V_{J1}$ and $V_{J2}$ also will not correspond precisely with the input signal. The net effect would be to re-establish some of the common mode signal which had been eliminated through use of the FIG. 2 circuitry. To avoid this, the embodiment of FIG. 4 also adds the output of the feedback amplifier 100 to the two junction voltages $V_{J1}$ and $V_{J2}$ through additional isolating resistors 104 and 106. These resistors 104 and 106 will preferably have values which are in the same proportion to the resistances of their respective voltage dividers 44, 42, as is the resistor 102 to resistors 34, 38. Preferably (but not necessarily):

$$R_{34} = R_{48} = R_{52}$$

and $$R_{38} = R_{46} = R_{50},$$

thus $$R_{102} = R_{104} = R_{106}.$$

Since the signal at the output of the feedback amplifier 100 (as attenuated by the resistors 102, 104, 106) corresponds to the input signal component lacking from the output of amplifier 10, the voltages $V_{J1}$ and $V_{J2}$ will then properly match the input signal, including its DC and low frequency components. The output signal from the amplifier 10, however, will lack these components.

When the amplifier illustrated in FIG. 4 is used to amplify audio signals generated by a phono cartridge, the input signal $V_{in}$ may possibly contain certain undesirable subsonic components introduced, for example, by warp of the record being played, rumble of the servo motor driving the turntable, etc. To eliminate these undesirable subsonic components the low pass filter characteristic of the feedback amplifier 100 will preferably be selected to pass these rumble and warp components but to roll off very rapidly at a frequency of, for example, 15 or 16 Hz. When designed in this fashion, the feedback amplifier 100 will also eliminate rumble and warp from the input signal, but will not attenuate or otherwise distort the lower frequency portion of the audio band of the input signal.

Figure 5:
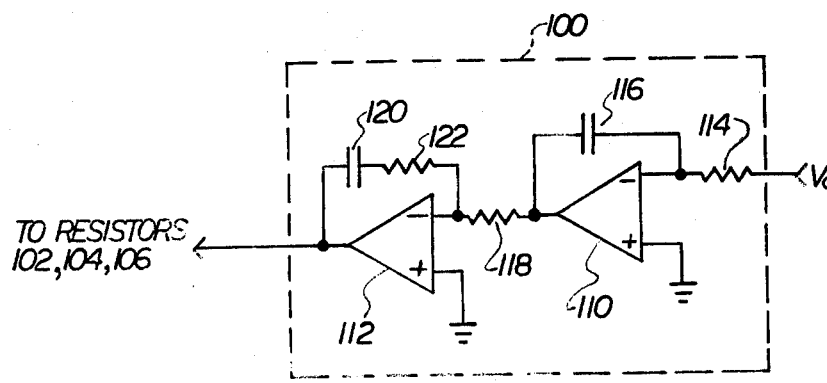
FIG. 5 is a more detailed circuit schematic of a portion of the circuitry of FIG. 4.

FIG. 5 illustrates one possible embodiment of the feedback amplifier 100. As illustrated in FIG. 5, the feedback amplifier 100 includes two inverting amplifiers 110 and 112 connected in series. The amplifier 110 is a differential amplifier having its noninverting input connected to ground and its inverting input connected to the output of amplifier 10 through an input resistor 114. Negative feedback is provided by a capacitor 116 connected between the output of amplifier 110 and its inverting input.

A differential amplifier, when connected as is amplifier 110, operates as an integrator. The output of amplifier 110 thus represents the integral of the signal $V_o$. The amplifier 110 therefore effectively has infinite gain for DC and very low frequency AC input signals. Even the smallest DC deviation of the input signal from ground potential will eventually cause the output of an amplifier 110 to reach positive or negative full scale. The circuit 110 is, however, quite insensitive to AC input signals having frequencies greater than several tens of Hertz. The frequency response of the integrator is determined by the relationship between the values of the capacitor 116 and resistor 114. In audio amplifier applications it is desirable that the integrator respond to only subsonic frequencies, hence these two components should be chosen so that the frequency response of the integrator rolls off at a frequency below 20 Hz, which is commonly accepted as the lower end of the audio frequency range.

In the FIG. 5 embodiment, the feedback amplifier 100 also includes a second inverting amplifier 110 connected to the output of the integrator 110. This amplifier 112 is included to invert the output of the amplifier 110 so that the net transfer characteristic of the feedback amplifier 100 includes a positive rather than a negative gain. It is presently preferred that the amplifier 112 also have a low pass filter characteristic such that, together, the two amplifiers provide a second order low pass filter, providing very fast roll-off at frequencies above, for example, 15 Hz. To provide the desired low pass filter characteristic, the second amplifier 112 includes an input resistor 118 and a feedback network consisting of a series combination of a capacitor 120 and a resistor 122.

Although the invention has been described with respect to a preferred embodiment, it will be appreciated that various rearrangements and alterations of parts may be made without departing from the spirit and scope of the present invention, as defined in the appended claims.

What is claimed is:
1. Apparatus comprising:
   amplifier means responsive to an input signal provided on an input terminal for providing an output signal corresponding to an amplified said input signal on an output terminal, and having first and second power input terminals, said amplifier means comprising a differential amplifier having inverting and noninverting inputs, means for connecting said noninverting input to said input terminal, and feedback means comprising a feed back impedance connected between said output terminal and said inverting input and an input impedance connected between said inverting input and a fixed potential, whereby said amplifier means has a very high input impedance and a gain determined by the ratio of said feedback and input impedances;
   power supply means having first and second power output terminals across which a power supply voltage is provided;
   first voltage divider means including first and second impedance means connected in series between said amplifier output and said first power output terminal of said power supply means,
   second voltage divider means including third and fourth impedance means connected in series between said amplifier output and said second power output terminal of said power supply means; and
   means for applying the signal at the junction of said first and second impedance means to said first power input terminal of said amplifier and the signal at the junction of said third and fourth impedance means to said second power input terminal of said amplifier;
   wherein said first, second, third, and fourth impedance means have values selected so that the signals appearing at said first and second power input terminals each includes a component corresponding to said input signal; and
   further comprising means for eliminating a component from the output of said differential amplifier and means for adding a signal porportional to the component thus eliminated to the signals appearing at the junction of said first and second impedance means, and the junction of said third and fourth impedance means.

2. Apparatus comprising:
   amplifier means responsive to an input signal provided on an input terminal for providing an output signal corresponding to an amplified said input signal on an output terminal, and having first and second power input terminals, said amplifier means comprising a differential amplifier having inverting and noninverting inputs, means for connecting said noninverting input to said input terminal, and feedback means comprising a feedback impedance connected between said output terminal and said inverting input and an input impedance connected between said inverting input and a fixed potential, whereby said amplifier means has a very high input impedance and a gain determined by the ratio of said feedback and input impedances;

power supply means having first and second power output terminals across which a power supply voltage is provided;

first voltage divider means including first and second impedance means connected in series between said amplifier output and said first power output terminal of said power supply means, second voltage divider means including third and fourth impedance means connected in series between said amplifier output and said second power output terminal of said power supply means; and means for applying the signal at the junction of said first and second impedance means to said first power input terminal of said amplifier and the signal at the junction of said third and fourth impedance means to said second power input terminal of said amplifier;

wherein said first, second, third, and fourth impedance means have values selected so that the signals appearing at said first and second power input terminals each includes a component corresponding to said input signal; and wherein said amplifier means further comprises feedback amplifier means and first coupling impedance means, said feedback amplifier means having gain, a lowpass transfer characteristic, and an input coupled to the output of said differential amplifier, and siad first coupling means being connected between the output of said feedback amplifier means and said inverting input of said differential amplifier, and further wherein second and third coupling impedance means are provided each connected between said output of said feedback amplifier means and a respective one of the junctions between said first and second and said third and fourth impedance means, whereby the output signal of said feedback amplifier means is subtracted from the output of said differential amplifier and added to the voltages at the junctions of said first and second, and third and fourth impedance means.

* * * * *